(12) United States Patent
Thuringer (10) Patent No.: US 6,973,150 B1
(45) Date of Patent: Dec. 6, 2005

(54) CYCLE SLIP DETECTION USING LOW PASS FILTERING

(75) Inventor: Daniel J. Thuringer, Cedar Rapids, IA (US)

(73) Assignee: Rockwell Collins, Cedar Rapids, IA (US)

( * ) Notice: Subject to any disclaimer, the term of this patent is extended or adjusted under 35 U.S.C. 154(b) by 796 days.

(21) Appl. No.: 09/840,946

(22) Filed: Apr. 24, 2001

(51) Int. Cl.[7] .......................... H04L 25/00; H04L 7/00
(52) U.S. Cl. ....................... 375/371; 375/376
(58) Field of Search ................ 375/332, 376, 375/327, 371, 373; 327/2, 141, 147, 156; 331/1 R, 25

(56) References Cited

U.S. PATENT DOCUMENTS

| | | | |
|---|---|---|---|
| 3,766,484 A | 10/1973 | Morris et al. ............... | 328/179 |
| 4,015,083 A * | 3/1977 | Bellisio ...................... | 375/376 |
| 4,059,825 A | 11/1977 | Greene ................. | 340/146.1 D |
| 4,516,250 A * | 5/1985 | Grimes ....................... | 375/328 |
| 4,595,927 A | 6/1986 | Menick ...................... | 343/390 |
| 4,737,971 A * | 4/1988 | Lanzafame et al. ......... | 375/371 |
| 4,743,912 A | 5/1988 | Enge et al. ................. | 342/390 |
| 4,860,321 A | 8/1989 | von der Embse ............. | 375/96 |
| 4,902,920 A * | 2/1990 | Wolaver ...................... | 327/12 |
| 5,036,294 A | 7/1991 | McCaslin ................... | 331/1 A |
| 5,790,613 A * | 8/1998 | Tateishi ...................... | 375/376 |
| 5,995,520 A | 11/1999 | Uchiki et al. ............... | 370/516 |
| 6,166,683 A | 12/2000 | Hwang ................. | 342/357.04 |
| 6,175,806 B1 | 1/2001 | Thuente ...................... | 701/213 |

FOREIGN PATENT DOCUMENTS

| | | | |
|---|---|---|---|
| WO | WO 86/00715 | 1/1986 | ............. G01S 1/24 |

OTHER PUBLICATIONS

R. C. Den Dulk, Electronics Letters, Jul. 7th 1988, Vo. 24, No. 14, pp. 880-882.*

* cited by examiner

*Primary Examiner*—Betsy L. Deppe
(74) *Attorney, Agent, or Firm*—Nathan O. Jensen; Kyle Eppele (57) ABSTRACT

A cycle slip detector and detection method for a phase comparison circuit are provided. The cycle slip detector includes a cycle slip detection filter possessing a predetermined filter bandwidth and a predetermined high frequency cut-off. The cycle slip detection filter receives a phase difference generated by the phase comparison circuit and transforms the phase difference into a filtered phase difference. The cycle slip detector further includes a compensator communicating with the cycle slip detection filter. The compensator compensates the magnitude based on a predetermined compensation response. The cycle slip detector further includes a cycle slip occurrence detector communicating with the compensator. The cycle slip occurrence detector compares a compensated magnitude of the filtered phase difference to a predetermined cycle slip threshold and generates a cycle slip output if the compensated magnitude exceeds the predetermined cycle slip threshold.

19 Claims, 10 Drawing Sheets

CYCLE SLIP DETECTION USING LOW PASS FILTERING

FIELD OF THE INVENTION

The present invention relates generally to a cycle slip detector, and more particularly to a cycle slip detector capable of providing a cycle slip detection and an estimation of cycle slip size.

BACKGROUND OF THE INVENTION

Modern electronic communications rely highly on communication systems that employ some sort of phase tracking. Electronic communication systems may be employed for a wide variety of needs including voice and data communications, positioning systems, etc.

One of the more common applications for digital data communications are positioning systems, such as the global positioning system (GPS) constructed for the U.S. armed services. There are other such systems around the world, but the discussion will hereinafter refer only to the GPS system. These positioning systems include satellite constellations that may be used to perform a triangulation of a corresponding receiver anywhere on the earth. This triangulation yields not only a latitude and longitude determination but also an altitude determination. Therefore, a GPS receiver may generate a positional fix in three dimensions.

One of the characteristics of a typical positioning system is that in order to generate a position fix, a receiver must be synchronized with the clock of the transmitting satellite(s). This is necessary because a distance (pseudorange) from a satellite to a receiver must be calculated using the time embedded in a satellite transmission. Therefore, if the clock in the receiver does not accurately track the clock in the transmitting satellite, the accuracy of the calculated pseudorange will be compromised and the range determination will be inaccurate.

Another application of digital communications is in synchronous voice and data communications, such as Time Division Multiple Access (TDMA) applications, for example. As in positioning systems, synchronization of the clock of the receiver with the clock of the transmitting device is required so that the data may be accurately detected.

Therefore, many common digital communication devices employ some sort of phase tracking in order to synchronize a receiver clock with the clock of the transmitting device. Synchronization is typically done through the use of a phase locked loop (PLL) or a frequency locked loop (FLL). For purposes of this discussion, reference will be made to the PLL, although the discussion equally well applies to the FLL. The difference between the two is that the PLL tries to maintain a zero phase angle difference between two waveforms while the FLL tries to maintain an approximately constant phase angle difference.

Figure 1:
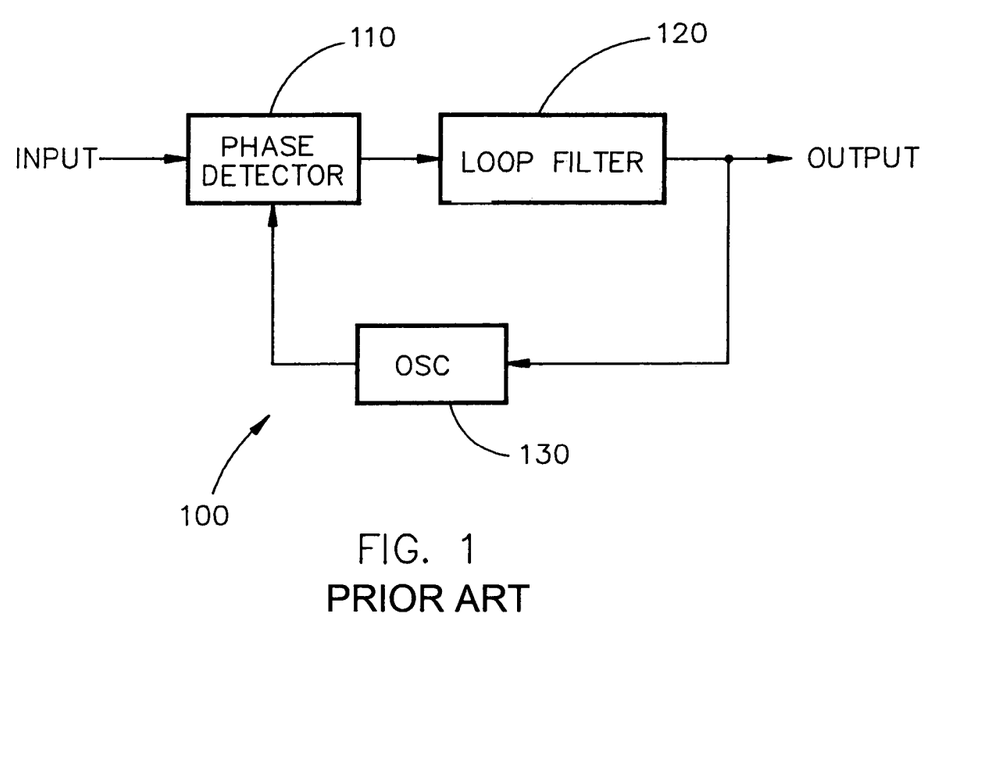
FIG. 1 is a block diagram of a typical PLL.

FIG. 1 is a block diagram of a typical PLL 100. There are various methods of implementing a PLL circuit, but all PLL circuits have three essential portions: a phase detector 110, a loop filter 120, and an oscillator 130. The phase detector 110 has an output that is connected to an input of the loop filter 120, and the loop filter 120 has an output that is connected to an input of the oscillator 130. The output of the oscillator 130 is fed back into the phase detector 110. The output of the loop filter 120 is the output of the PLL 100. The output is generally a demodulated data signal removed from the input waveform A, such as an embedded GPS data from a GPS satellite transmission, for example.

The phase detector 110 may be a comparator or mixer that compares the phases of two signals. The phase detector 110 has two inputs. In a typical PLL implementation, a first input receives an input waveform or a reference clock signal, and a second input receives the output of the oscillator 130. As a result of the phase comparison, the output of the phase detector 110 is a voltage that is proportional to the phase difference between the two input signals. Therefore, for example, if the input is a pure, unmodulated carrier wave and the oscillator 130 is providing a duplicate of the carrier wave, the output will be zero.

The loop filter 120 is typically a low pass filter that filters out higher frequency components from the output of the phase detector 10. However, the output of the loop filter 120 is not generally suitable for cycle slip detection. For example, in a GPS positioning system the modulated data is a 50 Hz binary phase shift keyed (BPSK) digital data signal and therefore the output of the loop filter 120 is the demodulated data signal.

The oscillator 130 is typically a voltage-controlled oscillator, as is known in the art. The output frequency of the waveform generated by the oscillator 130 is controlled by an input voltage fed back to the oscillator 130 from the loop filter 120. The oscillator 130 is therefore modulated by the output of the phase detector 110. The feedback from the phase detector 110 and from the loop filter 120 allows the oscillator 130 to phase lock with the input waveform. Consequently, the waveform produced by the oscillator 130 substantially tracks the input waveform.

Figure 2:
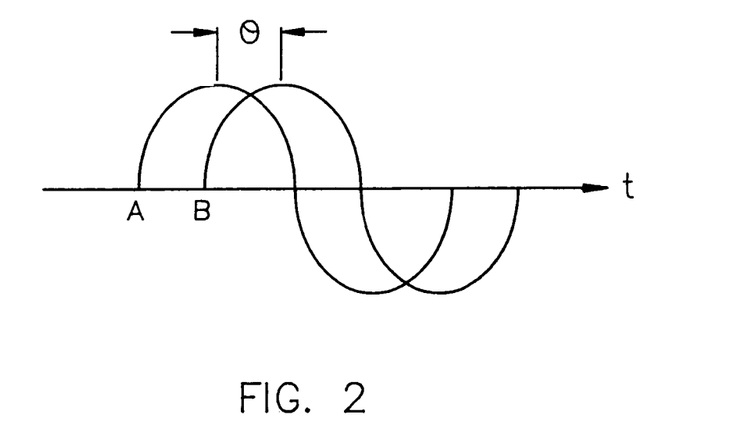
FIG. 2 shows two waveforms A and B having a phase difference.

FIG. 2 shows two waveforms A and B having a phase difference. Waveform A is an input into the PLL 100 and waveform B is the signal produced by the oscillator 130. In theory, the oscillator 130 perfectly tracks the input waveform A. It can be seen from this figure that a phase difference (typically denoted as theta or θ) exists between the two waveforms, indicating that the oscillator 130 is not perfectly tracking the input waveform A. Although this is undesirable, it does happen. If the phase excursions are large enough and occur rapidly enough, a cycle slip can occur.

A cycle slip is a type of anomaly or error condition where the phase tracking between the oscillator 130 and the input waveform A becomes great enough that the tracking is lost and the phase angle exceeds 360° (i.e., exceeds one full cycle). Therefore, the tracking may slip one or more cycles from the input (carrier) waveform A, and may slip ahead of or behind the input waveform A. As a result, in applications where a cycle count is important (such as in GPS type systems) or where cycle slips affect accuracy of the data output, cycle slips become troublesome. It is known in the art that cycle slips can occur and can affect accuracy of communication systems employing phase angle tracking.

The phase angle may not track perfectly under a variety of conditions. One condition is when ambient noise interferes with the input signal. This may be due to atmospheric conditions, electromagnetic interference from other electronic devices, etc. The result may be that the input waveform A changes too quickly for the oscillator 130 to follow. The oscillator 130 may not be able to change frequency quickly enough to track all changes in the input waveform A.

Another way in which cycle slip can occur is with drops in amplitude or partial loss of the signal. This might occur, for example, due to shading of the receiver from direct line-of-sight reception from the transmitting device. Signal loss may also occur due to noise. A momentary loss of receiver lock on the input waveform A may result. If the signal disappears, the PLL 100 has nothing to track. When the signal is re-acquired, the PLL 100 may have deviated from the phase of the input waveform A, or vice versa.

A third way in which a cycle slip may occur is due to vehicle dynamics. This refers to the motion of the receiver or a vehicle bearing the receiver. The vehicle may be, for example, an aircraft. If the vehicle is subjected to a sudden and abrupt acceleration, such as for example an aircraft affected by turbulence, the reception of the input waveform A may be perturbed in such a way that the input waveform A exhibits a sudden and abrupt phase shift. The oscillator 130 may not be able to follow such a phase excursion, and a cycle slip may result.

In the prior art, cycle slips have been addressed. A typical prior art approach has been to put a comparator at the output of the phase detector 110. If the output of the phase detector 110 exceeds a certain magnitude threshold, the prior art determines that a cycle slip has occurred.

However, the drawback of the prior art approach is that noise which occurs at higher frequencies is necessarily included in the comparison. The input waveform A may suffer from a rapid phase excursion due to the noise, even though a cycle slip is unlikely to occur. As a result, many false alarms may be generated.

In another prior art approach, one or more counters have been used to track the number of input and output cycles in order to determine when cycles are missing. This may be helpful in cases where signal loss occurs and is re-acquired, but is not satisfactory for vehicle dynamics where cycle slips occur due to sudden and violent physical excursions of the receiver. In addition, complex and costly circuitry is required.

What is needed therefore are improvements to cycle slip detectors.

SUMMARY OF THE INVENTION

A cycle slip detector adapted for use in a phase comparison circuit is provided according to one embodiment of the invention. The cycle slip detector comprises a cycle slip detection filter possessing a predetermined filter bandwidth and a predetermined high frequency cut-off. The cycle slip detection filter receives a phase difference generated by the phase comparison circuit and transforms the phase difference into a filtered phase difference. The cycle slip detector further comprises a compensator communicating with the cycle slip detection filter. The compensator compensates the magnitude based on a predetermined compensation response. The cycle slip detector further comprises a cycle slip occurrence detector communicating with the compensator. The cycle slip occurrence detector compares a compensated magnitude of the filtered phase difference to a predetermined cycle slip threshold and generates a cycle slip output if the compensated magnitude exceeds the predetermined cycle slip threshold.

A cycle slip detection method for detecting a cycle slip in a phase comparison circuit is provided according to an embodiment of the invention. The method comprises the step of filtering out phase difference frequency components above a predetermined high frequency cut-off to produce a filtered phase difference. The method further comprises the step of detecting a cycle slip in the filtered phase difference and generating a cycle slip output if a filtered phase difference magnitude exceeds a predetermined cycle slip threshold.

The above and other features and advantages of the present invention will be further understood from the following description of the preferred embodiments thereof, taken in conjunction with the accompanying drawings.

DETAILED DESCRIPTION

Figure 3:
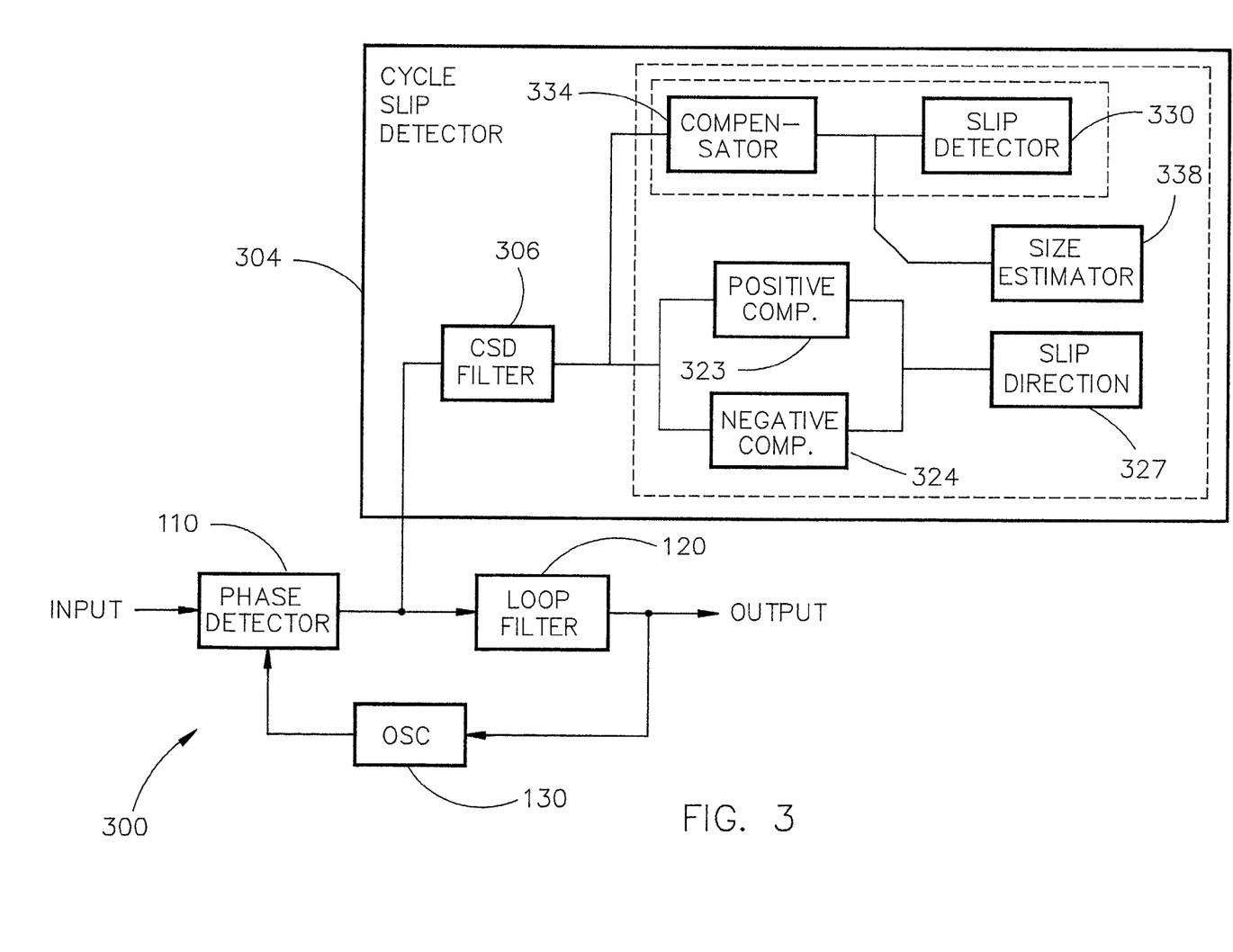
FIG. 3 is a block diagram encompassing two embodiments of a cycle slip detector for a PLL according to the invention.

FIG. 3 is a block diagram encompassing two embodiments of a cycle slip detector for a phase locked loop (PLL) 300 according to the invention. A cycle slip occurs in a phase comparison circuit when the output of the oscillator 130 no longer accurately tracks the input waveform. Two common phase comparison circuits are a phase locked loop (PLL) and a frequency locked loop (FLL). Although cycle slip can occur in both any type of phase comparison circuit, the discussion will focus on a PLL implementation for reasons of simplicity. The PLL 300 includes the phase detector 110, the loop filter 120, the oscillator 130, and a cycle slip detector 304. The cycle slip detector 304 may include a cycle slip detection filter 306, a compensator 334, a slip detector 330, a size estimator 338, a positive comparator 323, a negative comparator 324, and a slip direction detector 327.

In a first embodiment (small dashed line box), the cycle slip detector 304 may include the CSD filter 306, the compensator 334, and the slip detector 330. The CSD filter 306 receives the phase difference from the phase detector 110 and filters out the high frequency components. The low and mid-frequency components are not filtered out and are not substantially attenuated by the filtering. The filtering is performed because the mid-frequency components are the cause of cycle slip (discussed below in conjunction with FIG. 5), and because the high frequency components generally are not. It is therefore advantageous to remove the high frequency components and check the mid-frequency components for cycle slip.

Figure 8:
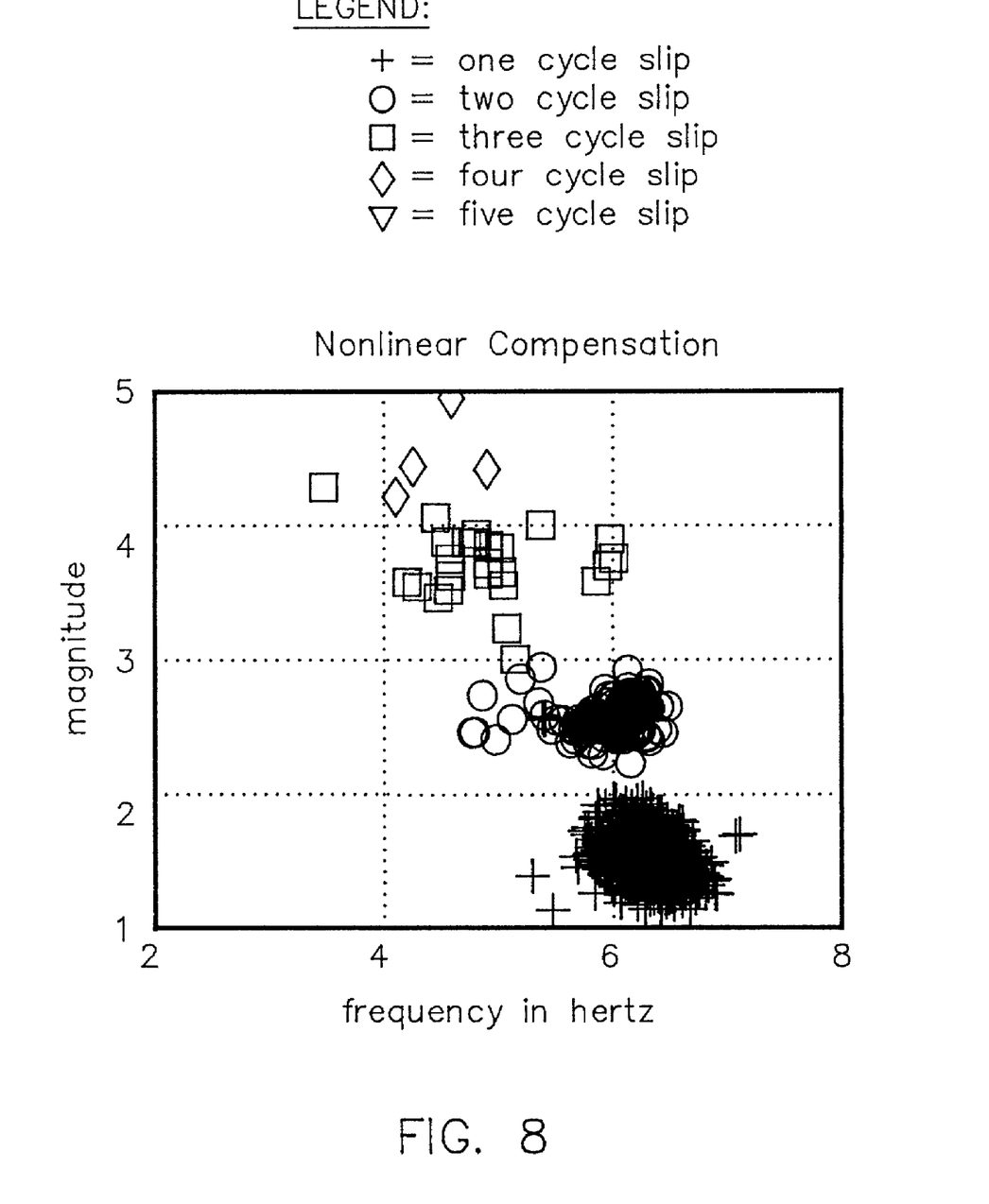
FIG. 8 shows a representative plot of a compensated CSD filter output.

The compensator 334 may adjust the magnitude of the filtered phase difference to compensate for any non-linearities in the output of the phase detector 110 or in the output of the CSD filter 306 (see FIG. 8 and accompanying discussion). The slip detector 330 compares the compensated magnitude of the filtered phase difference to a predetermined cycle slip threshold. If the compensated magnitude exceeds the predetermined cycle slip threshold, a cycle slip has occurred and the cycle slip detector 304 generates a cycle slip output. In this embodiment, the cycle slip size and direction are not capable of being determined. It should be understood that although the compensation is included mainly to aid in cycle slip size determination, the compensation may also aid in just detecting a cycle slip, even when the cycle slip size is not determinable.

The slip detector 330 may be implemented in hardware as an absolute value detector and a comparator. The absolute value of the filtered phase difference magnitude, either positive or negative, is compared to a predetermined cycle slip threshold. If the absolute value exceeds the predetermined cycle slip threshold, the cycle slip detector 304 may generate a cycle slip output.

Alternatively, the slip detector 330 may be implemented in hardware as two comparators, one to detect a negative bipolar pulse peak that negatively exceeds a predetermined negative cycle slip threshold, and a second comparator to detect a positive pulse peak that positively exceeds a predetermined positive cycle slip threshold. In a further alternative embodiment, both the compensator 334 and the slip detector 330 may be implemented in software routines.

In a second embodiment, the cycle slip detector 304 detects a cycle slip direction and estimates a cycle slip size. The cycle slip detector 304 of the second embodiment includes the cycle slip detection filter 306, the compensator 334, and the slip detector 330 as before, and further includes the size estimator 338, the positive comparator 323, the negative comparator 324, and the slip direction detector 327.

Figure 6A:
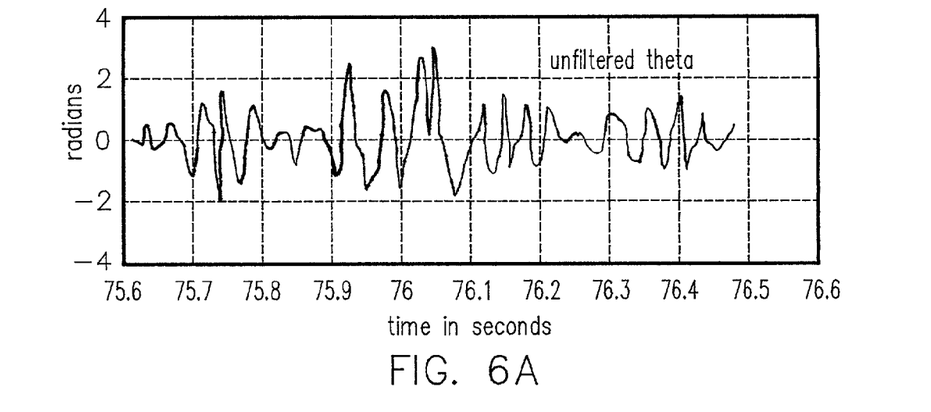
FIG. 6 shows a phase difference plot, a filtered phase difference plot, and a phase error plot that include a cycle slip event.
Figure 6B:
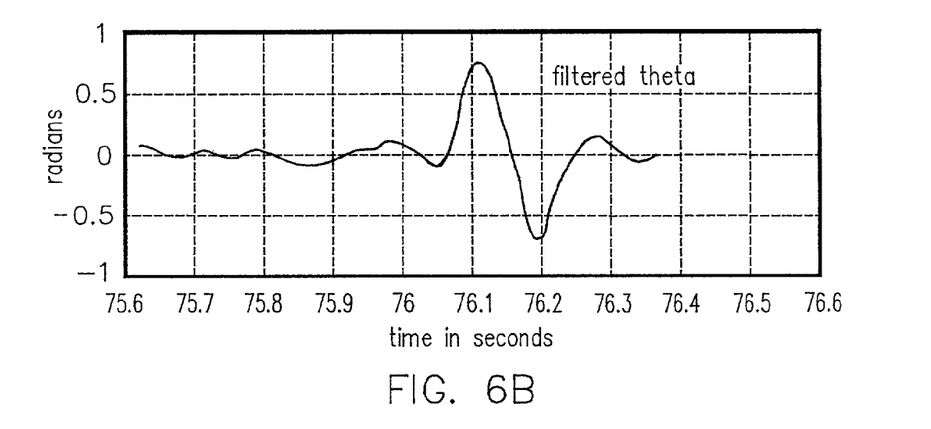
Figure 6C:
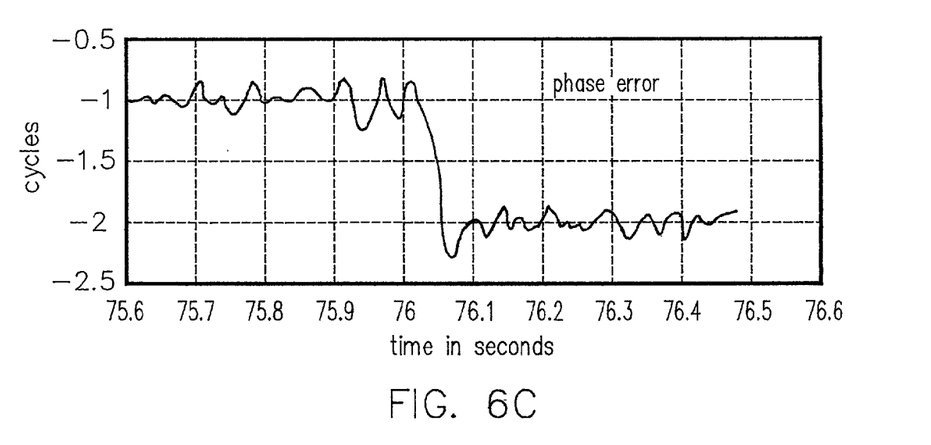

The positive comparator 323 and the negative comparator 324 detect positive and negative peaks in a bipolar pulse, such as that shown in FIG. 6. If the peaks exceed positive and negative cycle slip thresholds, positive and negative cycle slip outputs are generated by the positive comparator 323 and the negative comparator 324 respectively. The second embodiment further includes a cycle slip direction detector communicating with the positive comparator and the negative comparator. The cycle slip direction detector receives the positive and negative cycle slip outputs. The cycle slip direction detector generates a positive cycle slip output if a positive bipolar pulse peak occurs first in the bipolar pulse and if the bipolar pulse frequency is within a predetermined mid-frequency range. Conversely, the cycle slip direction detector generates a negative cycle slip output if a negative bipolar pulse peak occurs first in the bipolar pulse and if the bipolar pulse frequency is within the predetermined mid-frequency range.

The positive comparator 323 and the negative comparator 324 may feed control information to the compensator 334. The control information may include, for example, an indication of a slip direction, a bipolar pulse frequency, or handshaking information (such as the time of the bipolar pulse, for example).

The size estimator 338 is employed by the second embodiment to determine a cycle slip size. The size estimator 338 may compare a magnitude of the compensated, filtered phase difference to one or more predetermined thresholds or ranges in order to generate a cycle slip size number. Alternatively, the size estimator 338 may use a lookup table (in a software routine) to generate a corresponding cycle slip size number from a magnitude input number. The number may represent partial or whole cycle slips (see FIG. 8 and accompanying discussion).

The cycle slip detector 304 (and the components of the PLL 300) may be implemented as discrete circuitry blocks as shown. Alternatively, some or all of the blocks of the PLL 300 may be implemented as software routines executed in a processor (not shown). If the input waveform is a digitized signal, all of the blocks may be performed in a processor of some sort.

In the prior art, cycle slip detection does not remove the high frequency components from the phase difference. Therefore, prior art cycle slip detection suffers from false alarms that result from erroneously detecting noise as cycle slips. A common response to such false alarms has been to compensate by raising the comparison threshold of an output voltage of the phase detector. In the prior art, the comparison threshold may be set at, for example, around 60 to 70 degrees of phase difference. The comparison threshold assumes that if a phase difference exceeds a certain amount, a cycle slip has occurred. However, fewer genuine cycle slips are detected as a consequence.

The CSD filter 306 may be needed in addition to the loop filter 120. The loop filter 120 may filter out some of the high frequency components, but is chosen in order to achieve phase lock and demodulation of data on an incoming carrier wave. Therefore, the loop filter 120 may not have a satisfactory bandwidth and cut-off for cycle slip detection and may not provide a suitably filtered phase difference. In addition, the loop filter 120 typically allows a DC bias onto its output. This DC bias renders cycle slip detection difficult.

The CSD filter 306 may be any type of suitable filter, such as a low pass filter that significantly attenuates frequencies above about 8 Hz (depending on the characteristics of the particular PLL implementation). It is anticipated that a PLL or FLL circuit for a low data rate demodulation may have a slower response time than a PLL or FLL circuit for a high data rate demodulation, and therefore the CSD filter 306 may have different cut-off frequencies as needed.

Alternatively, the CSD filter 306 may be a band pass filter having an upper frequency cut-off of about 8 Hz, as in the low pass filter embodiment. Because the low frequency components are not a concern, they do not have to be filtered out. The critical factor is that high frequency components are removed, and a band-pass filter may also accomplish this.

The primary causes of cycle slip are noise acting on the input signal, a loss of signal, or vehicle dynamics. The noise can enter the system at any frequency and will affect the system in different ways, depending on the frequency. A loss of signal may result in a loss of phase tracking and phase lock. Vehicle dynamics refers to the motion of the vehicle bearing a receiver or other device containing a PLL. If the vehicle is subjected to a sudden and abrupt acceleration, the reception of the input waveform A may be perturbed in such a way that the input waveform A exhibits a sudden and abrupt phase shift.

Generally, the high frequency components are any frequencies above about 8 cycles per second (Hz). However, the high frequency components are not strictly limited to those frequencies of 8 Hz or above, with the high frequency cut-off of the filtering depending on the characteristics of the particular phase comparison circuit and loop filter 120.

The filter bandwidth and high frequency cut-off will generally depend on at least three factors. The first factor is the loop characteristics and data rate. For a high data rate, the loop characteristics (and therefore the filtering bandwidth and high frequency cut-off) must be higher in order to accommodate the modulated data within an input waveform.

The second factor is the vehicle dynamics. If the PLL or FLL is employed in an aircraft, for example, the loop characteristics (i.e., the filtering bandwidth and high frequency cut-off) may require a wider cycle slip detection filtering bandwidth than will be required by a fixed or ground-based application (due to the higher likelihood and larger distances of vehicle excursions). The third factor is the quality of the oscillator 130. A high quality oscillator capable of generating a narrow bandwidth output will better track the input waveform. Therefore the filtering may employ a narrow bandwidth and a relatively low cut-off point.

In one embodiment, the CSD filter 306 may be a fifth order Butterworth filter with a bandwidth of about 7 Hz. This arrangement may be suitable for an implementation with a second order PLL having a natural frequency of 5 Hz and a damping factor of 0.7071.

The CSD filter 306 preferably models a non-linear system and an iterative approach may be used to develop the CSD filter 306. This may be done through simulation or through measurement in a phase comparison circuit. An initial filter choice should approximate the frequency response at the oscillator output in terms of bandwidth. In addition, the initial filter choice should preferably be chosen to have an order that is one or two orders higher than the PLL 300. The CSD filter 306 in one embodiment may flag a cycle slip if the absolute value of the filter output exceeds approximately 30 degrees of phase difference. The CSD filter 306 may then be iteratively adjusted in order to arrive at a final design. If the design is producing too many false alarms, then too much noise is being allowed into the system. Therefore, the filter bandwidth may be reduced or the cut-off may be made sharper (i.e., by adding poles to the filter). If the design is missing too many cycle slips, then too much signal is being removed. Therefore the bandwidth may be increased or the cut-off may be made less steep (i.e., by reducing poles). After the false alarms and missed detections have been minimized, the threshold can be raised to eliminate false alarms, or lowered to eliminate missed detections.

As the iterative filter selection process winds down, the last false alarms and missed detections can become difficult to remove. It can be very useful to create spectral plots (discussed below in conjunction with FIG. 5). However, note that the phase difference in a PLL is not stationary, therefore only short fast Fourier transforms (FTTs) can be used (i.e., only a small portion of the time domain can be converted into the frequency domain).

Figure 4:
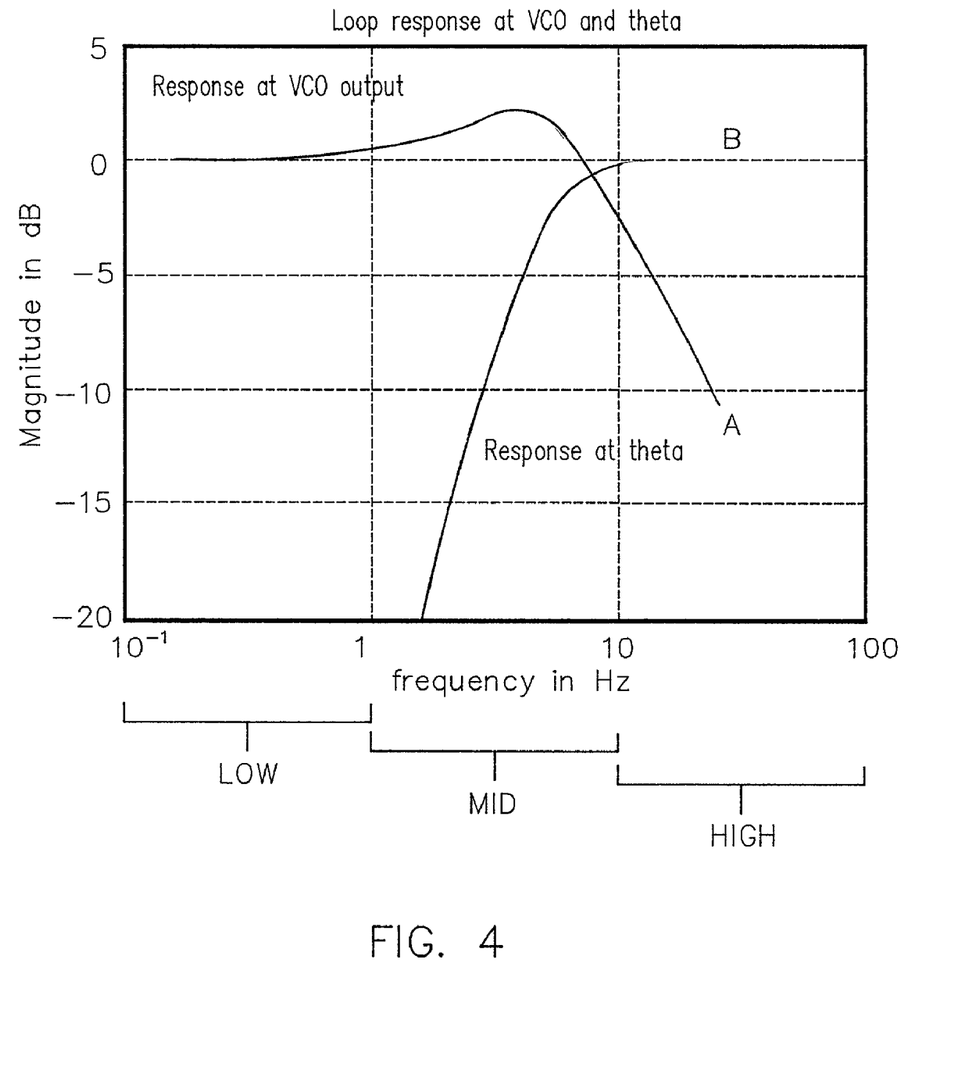
FIG. 4 is an approximate closed loop response at the output of the oscillator and at the output of the phase detector for a second order PLL.

FIG. 4 is an approximate closed loop response at the output of the oscillator 130 and at the output of the phase detector 100 for a second order PLL. The transfer function A is that of the response at the oscillator output, and the transfer function B is that of the response at the phase detector output (theta). Therefore, there are three distinct frequency regions in the PLL frequency response: a low frequency region; a mid-frequency region; and a high frequency region.

The low frequency region is from about 0 Hz to about 1 Hz and has a transfer function magnitude at the oscillator output of approximately 0 dB. Because the low frequency transfer function magnitude is zero, the PLL completely tracks any noise or reasonable dynamics in this region and removes noise and dynamics from the phase difference. Therefore, noise or dynamics in this region cannot cause a cycle slip.

The mid frequency region is from about 1 Hz to about 8 Hz and has a transfer function magnitude greater than 0 dB at the oscillator output. Because the mid-frequency transfer function magnitude is greater than zero, any mid-frequency noise or dynamics introduced into the system will be amplified. The amplification makes noise and dynamics in this region more difficult for the PLL 300 to track, which means that noise and dynamics in this frequency range may cause cycle slips.

The high frequency region starts at approximately 8 Hz and continues to infinity, with a transfer function magnitude less than 0 dB at the oscillator output. Because the high frequency transfer function is less than zero, the PLL cannot track noise or dynamics in this region at all. Since the oscillator 130 cannot track the high frequency noise and dynamics, they are present at the output of the phase detector. Therefore, any cycle slip detection that uses the phase difference to detect a cycle slip should ignore these high frequency components.

The frequency divisions given above are not limiting and are discussed for purposes of illustration. It should be understood that the actual frequencies encompassed by the low, mid, and high frequency regions will be determined by the loop characteristics of a particular phase comparison circuit. Therefore, in implementation, the high frequency cut-off may be above or below 8 Hz.

Figure 5A:
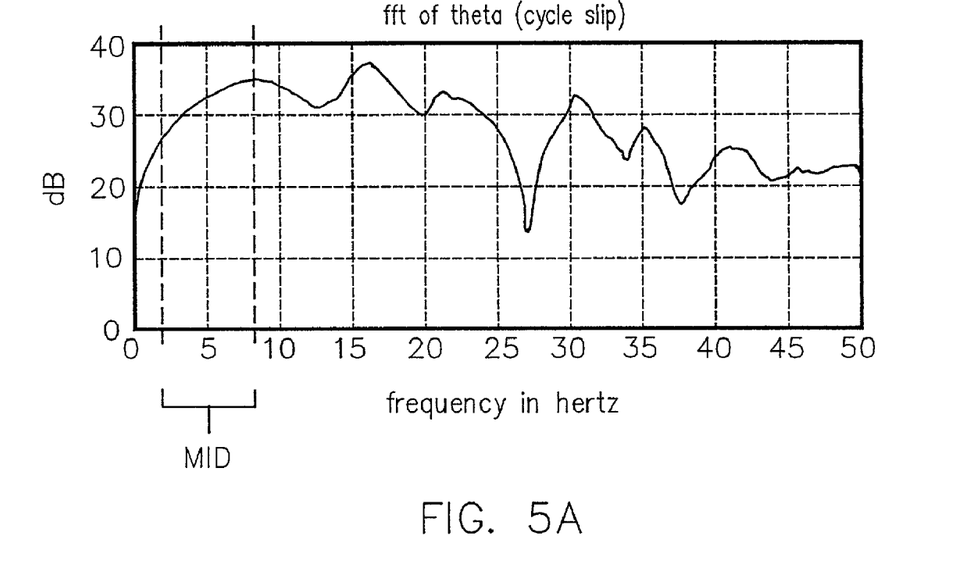
FIG. 5 includes an upper plot that shows representative frequency components of the phase difference when a cycle slip occurs.
Figure 5B:
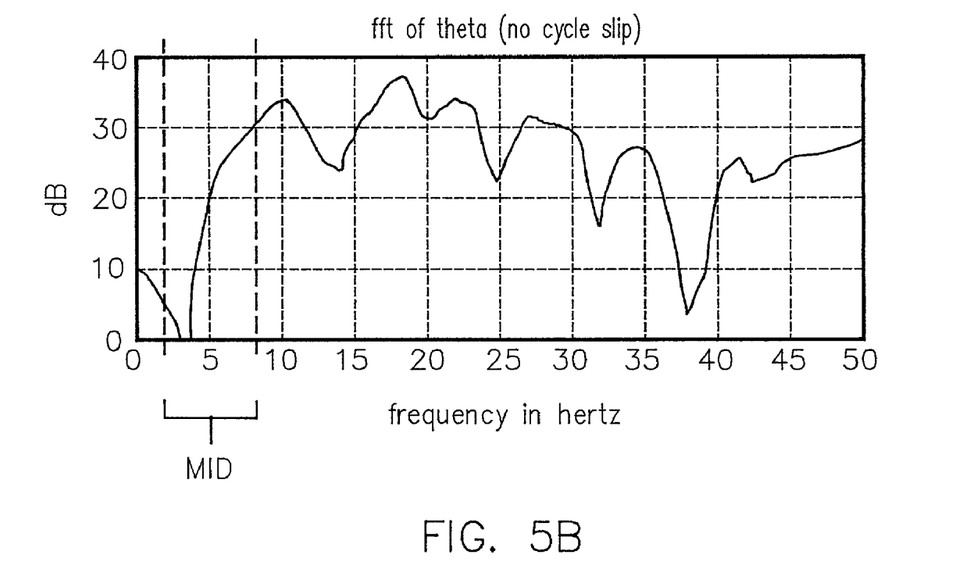

FIG. 5 includes an upper plot that shows representative frequency components of the phase difference when a cycle slip occurs. The lower plot shows a representative event with a noise phase difference, but without a cycle slip. The plots are Fourier transforms that convert the time domain signals into the frequency domain. The plots therefore show a frequency response over a frequency spectrum.

While the mid-frequency regions (1–8 Hz) of these two plots do not look very different, integrating the mid-frequency region of the FFT spectra for each event shows that the upper event (containing the cycle slip) contains about 110 dB more power than the lower event (no cycle slip). The high frequency region for the two events are different, but since the loop filter ignores the high frequency region, the differences are not important.

FIG. 6 shows a phase difference plot (upper), a filtered phase difference plot (middle), and a phase error plot (lower) that include a cycle slip event. At a time of about 76.1 seconds, the filtered phase difference (middle plot) shows two large spikes at about positive 0.7 radians and negative 0.7 radians. In addition, the phase error (lower plot) rapidly changes from –1 cycles to –2 cycles, indicating a cycle slip.

Figure 7A:
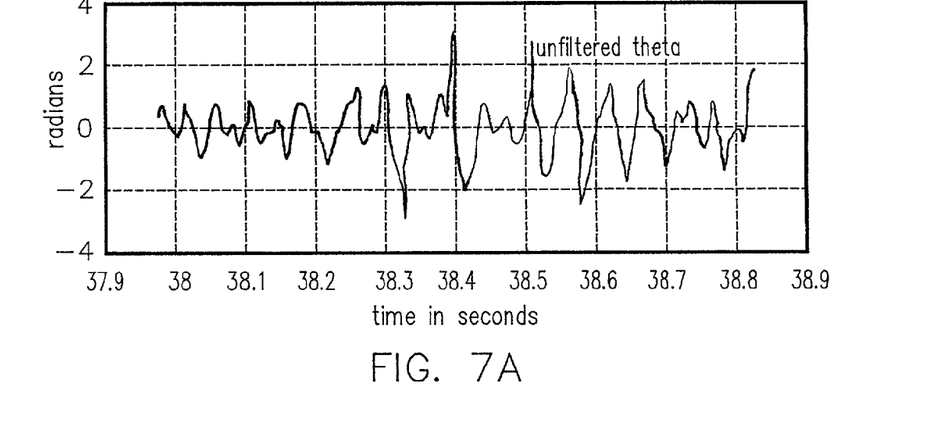
FIG. 7 shows a phase difference plot, a filtered phase difference plot, and a phase error plot that include a possible false alarm event due to noise.
Figure 7B:
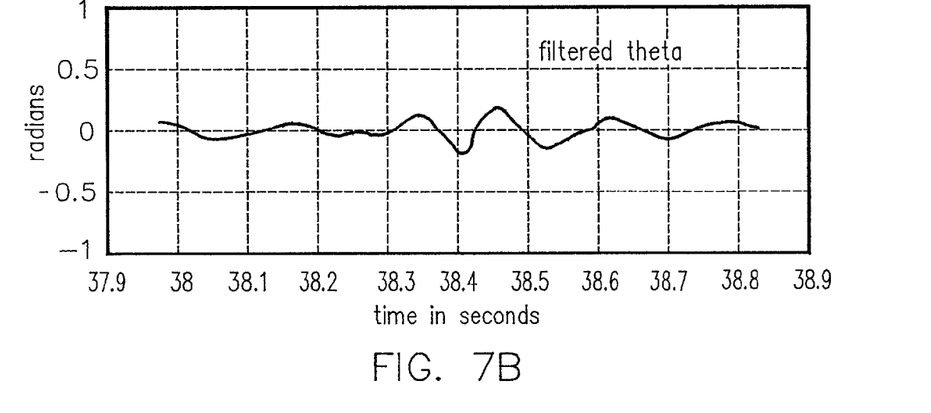
Figure 7C:
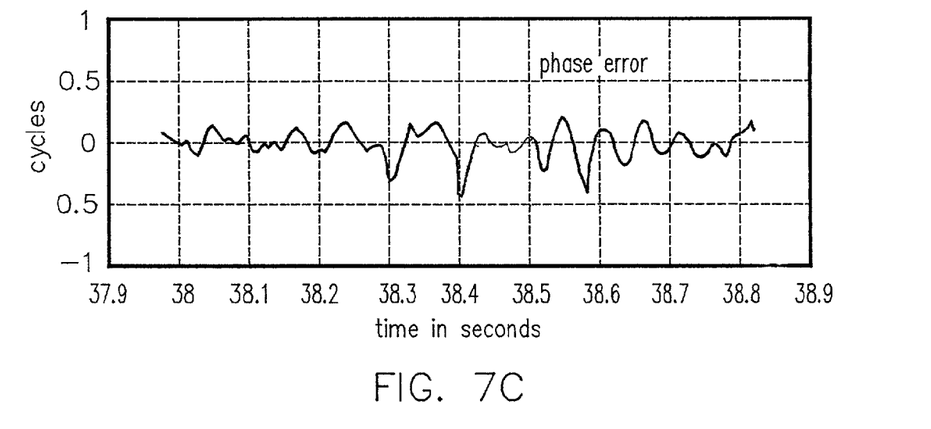

FIG. 7 shows a phase difference plot (upper), a filtered phase difference plot (middle), and a phase error plot (lower) that include a possible false alarm event due to noise. Notice that there is a very large spike in the unfiltered phase difference (upper plot) although the filtered phase difference (middle plot) remains well behaved and never exceeds 0.25 radians.

It can be seen from this figure that while the noise burst event has a large unfiltered phase difference, it has a small filtered phase difference. This is in contrast to the cycle slip event of FIG. 6, which has a large filtered phase difference although its unfiltered phase difference is not significantly different than the one shown in FIG. 7. Therefore, a cycle slip detector that looks at the unfiltered phase difference will likely suffer from either a missed detection or a false alarm. This is inevitable because the unfiltered phase difference associated with the cycle slip has a smaller peak magnitude than the unfiltered phase difference associated with the noise. However, the filtered phase difference associated with the cycle slip displays a very detectable bipolar pulse, allowing for accurate detection of the cycle slip.

It has been experimentally determined through simulation that the filtered phase difference waveform always has the same bipolar pulse shape when a cycle slip occurs, and only when a cycle slip occurs (i.e., if and only if there is a cycle slip). The filtered phase difference waveform assumes this shape because the large positive phase difference of a phase excursion increases the frequency of the oscillator 130, and the large negative phase difference is needed to bring the frequency back in line with the input waveform.

The two alternating peaks of the bipolar pulse of FIG. 6 may be used to determine both a cycle slip occurrence and a cycle slip direction. Detection of even one peak of the characteristic bipolar pulse may be used to determine that a cycle slip has occurred, and a cycle slip may therefore be flagged. However, for a cycle slip direction determination, both the positive and negative peaks of the bipolar pulse must be identified. If two bipolar peaks are not detected, a cycle slip may be still be flagged but the cycle slip direction cannot be determined and therefore the cycle slip cannot be corrected.

If both peaks are detected and the positive peak occurs first, a positive cycle slip is determined. If both peaks are detected and the negative peak occurs first, a negative cycle slip is determined.

In addition to determining the occurrence of both bipolar pulse peaks, the two opposing peaks must occur within a certain time window for the cycle slip direction to be determined, i.e., the bipolar pulse must have a frequency within the mid-frequency region of the oscillator transfer function (typically between about 1 Hz and about 8 Hz). This may be seen from the transfer function of FIG. 4. If the bipolar pulse is in the low frequency range, i.e., below about 1 Hz, then even if two opposing peaks are detected, the cycle slip direction still cannot be determined, as the transfer function of the oscillator should not allow pulses outside of the medium frequency range. Likewise, the bipolar pulse should not appear in the high frequency range, and a cycle slip also cannot be corrected in this case.

One way in which the two opposing bipolar pulse peaks may be compared is through a time stamp on each peak determination. The time stamp may be fed to a processor, along with the positive or negative peak determination output. The processor may therefore compare the time stamps to determine the frequency of the bipolar pulse peaks. The frequency is the inverse of twice the time period between the positive and negative peaks (i.e., f=(1/(2*time between peaks)).

Alternatively, the output of the CSD filter 306 may be digitized and the magnitude comparison may be performed in a processor that detects bipolar pulse peaks and measures the time period between the peaks. Furthermore, the output of the phase detector 110 may be a digital value, and the CSD filter 306 may optionally be implemented in a software routine.

When the cycle slip occurrence has been determined, a further step may be to estimate the size of the cycle slip. More than one cycle slip may have occurred. The cycle slip size may be estimated by looking at the magnitude present at the output of the CSD filter 306. However, the magnitude output may need further processing before the cycle slip size (i.e., the number of cycle slips) may be determined. The output of the CSD filter 306 may need to be compensated for non-linearities induced by the PLL circuit 300 and/or the CSD filter 306.

FIG. 8 shows a representative plot of a compensated CSD filter output. The plot compares the CSD filter output magnitude to the bipolar pulse peak frequency, after a nonlinear compensation. The nonlinear compensation may aid in determining a cycle slip size by adjusting the output of the CSD filter 306. In embodiments where the output of the CSD filter 306 is a digital value, a compensation table and software routine may be used to determine a cycle slip size. The compensation table may relate a magnitude to a cycle slip value or values. For example, if the output of the CSD filter 306 is between 6 and 7 Hz, the table may output a gain value which can be used to adjust the CSD output. This compensated value can then be compared to thresholds to determine the size of the cycle slip.

The input to the cycle slip compensation algorithm may be the peak positive value, the peak negative value, or some other combination of the two. Therefore, in one embodiment, the compensation value may be based on a difference in positive and negative peak magnitudes.

It should be understood that the cycle slip detection according to the invention may accommodate different demodulation schemes. For example, the cycle slip detection according to the invention may output a cycle slip count for whole integer cycle slips. In addition, for digital data modulation schemes, the cycle slip detection may output the cycle slip size of less than one. For example, in a BPSK modulation scheme outputting two digital values, the cycle slip detection may detect a one-half cycle slip. Furthermore, for quadrature phase shift keying (QPSK) modulation applications, the cycle slip detector may be able to detect a one-quarter cycle slip.

Figure 9:
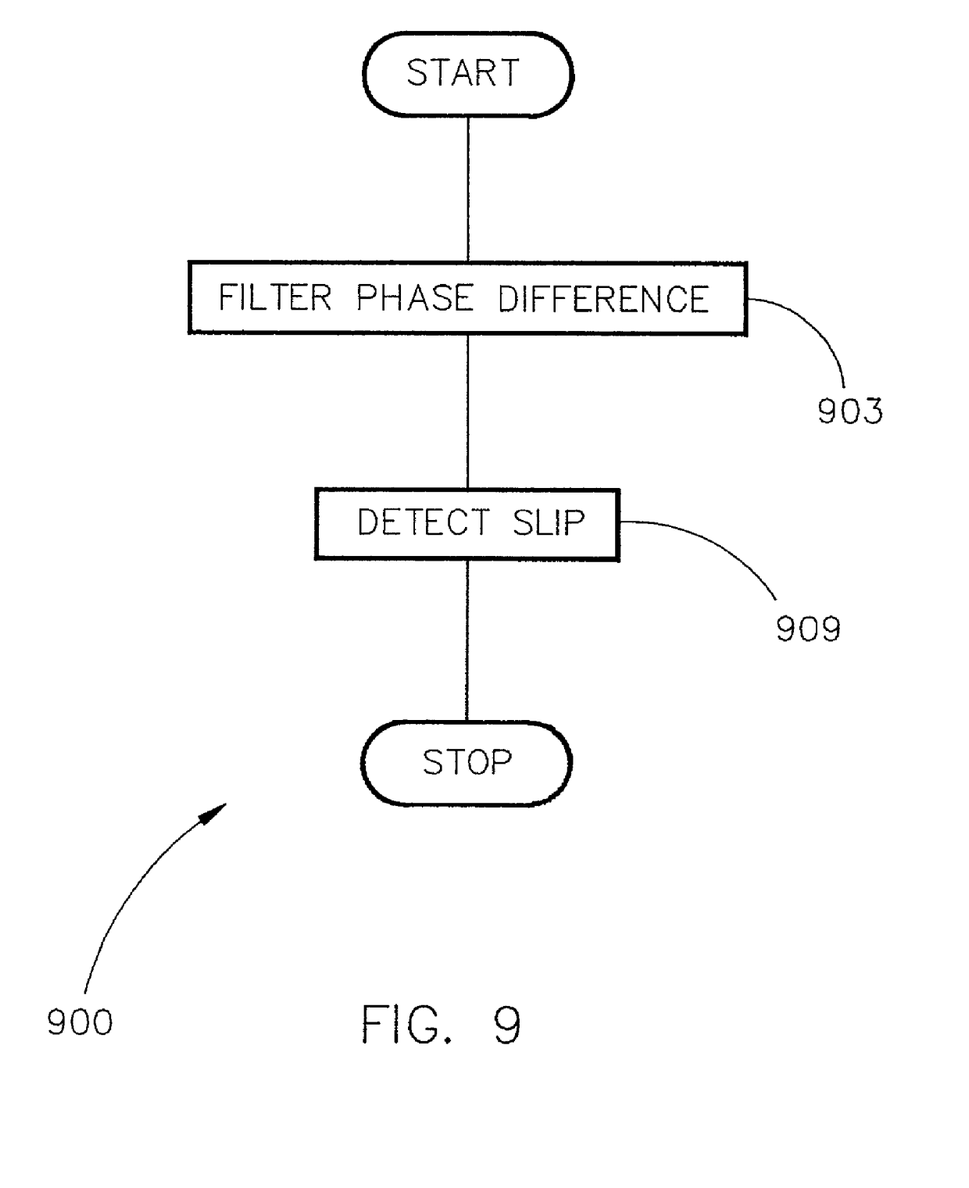
FIG. 9 is a flow chart of one embodiment of a cycle slip detection method according to the invention.

FIG. 9 is a flow chart 900 of a first embodiment of a cycle slip detection method according to the invention. In step 903, a phase difference output from a PLL is filtered. The filtering removes high frequency signal components present in the phase difference due to noise and/or vehicle dynamics. The low or band-pass filtering is performed because the low frequency region of the phase difference output does not cause cycle slips, the mid-frequency region can cause cycle slips, and the high frequency region contains strong noise bursts.

In step 909, the filtered phase difference is used to detect a cycle slip. In one embodiment of the detection step, a cycle slip is detected in the filtered phase difference and a cycle slip output is therefore generated if a filtered phase difference magnitude exceeds a predetermined cycle slip threshold.

In another embodiment of the detection step, the magnitude of the filtered phase difference is compensated, based on a predetermined compensation response. The compensation produces a compensated magnitude. An absolute value magnitude is generated from the compensated magnitude. A cycle slip is detected when the absolute value magnitude exceeds a predetermined cycle slip threshold; and a cycle slip output is generated in response.

In yet another embodiment, the magnitude of the filtered phase difference is compensated, based on a predetermined compensation response. The compensation produces a compensated magnitude. A positive bipolar pulse peak is detected in the filtered phase difference if the filtered phase difference positively exceeds a predetermined positive cycle slip threshold. A negative bipolar pulse peak is detected in the filtered phase difference if the filtered phase difference negatively exceeds a predetermined negative cycle slip threshold. A cycle slip output is generated if a positive bipolar pulse peak or a negative bipolar pulse peak are detected.

By using a filtered phase difference according to the invention, the cycle slip can be efficiently and reliably detected, and without incorrect cycle slip detections due to noise. The receiver (or other device) may therefore have knowledge of cycle slip occurrences, and may know when a received data is potentially faulty. In addition, the cycle slip output may be used to correct a cycle slip occurrence (discussed below).

Figure 10:
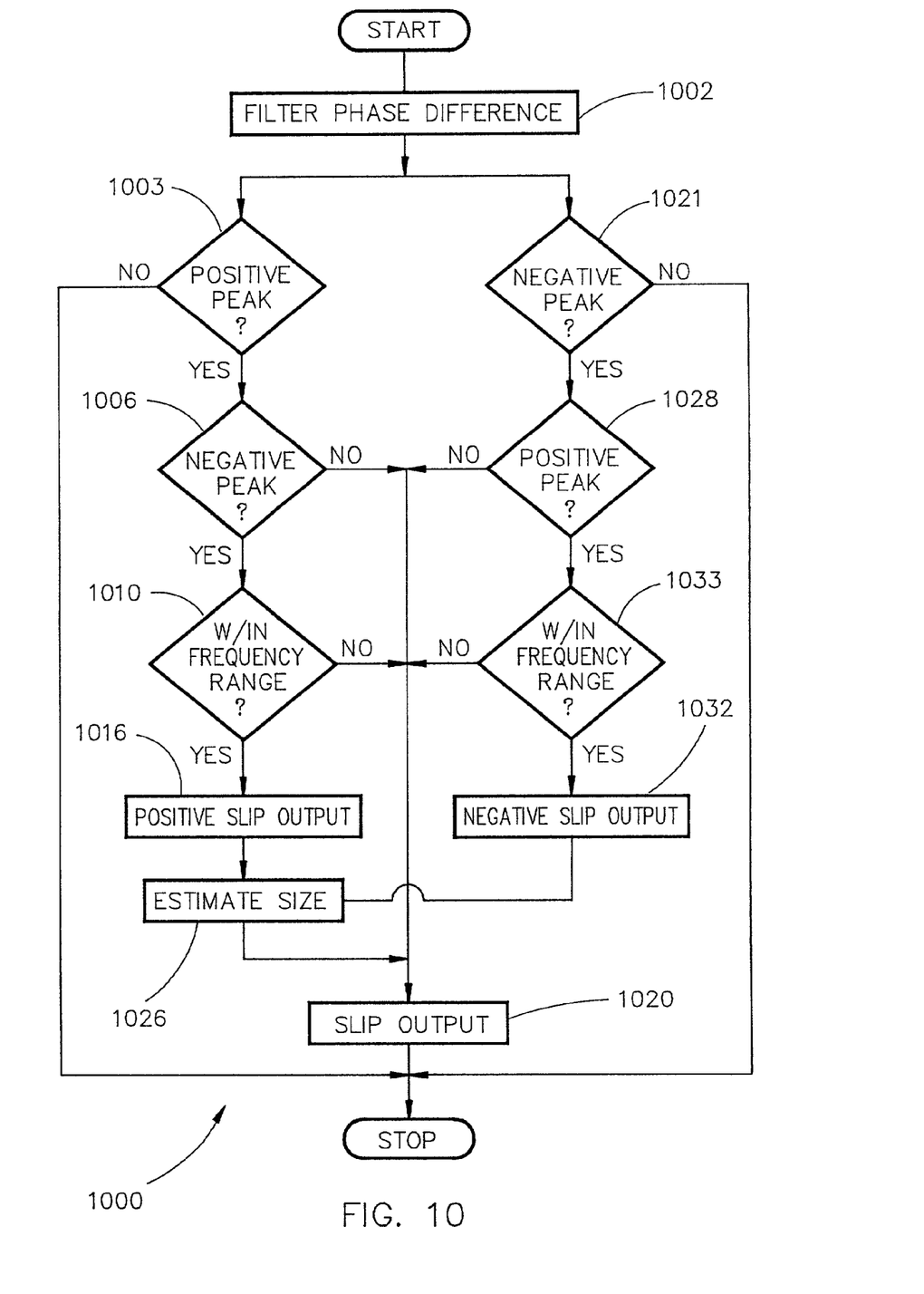
FIG. 10 is a flow chart of another embodiment of a cycle slip detection method according to the invention.

FIG. 10 is a flow chart 1000 of another embodiment of a cycle slip detection method according to the invention. In this method, not only is the cycle slip detected, but the size and direction of the cycle slip is also determined. The flowchart 1000 may be implemented in a loop that substantially continuously monitors a filtered phase difference output for bipolar pulse peaks.

The method employs two parallel branches that may be used to detect the positive and negative peaks of the bipolar pulse. Because a bipolar pulse includes both a positive peak and a negative peak, the two peaks may be detected in order to determine a cycle slip direction. It should be understood that if one path generates a cycle slip direction output, the other path will not.

In step 1002, the phase difference output is filtered. The filtering may be a low-pass or band-pass filtering, as previously discussed.

In step 1003, the filtered phase difference (i.e., the output of the cycle slip detector filter 306) is compared to a predetermined positive cycle slip threshold. This may be done in hardware by a comparator or may be done in a software routine by comparing a filtered phase difference magnitude number to a threshold number. The predetermined positive cycle slip threshold may be set at a desired value, such as, for example, a positive 0.5 radians. If the filtered phase difference positively exceeds the predetermined positive cycle slip threshold, then a positive peak of a bipolar pulse has occurred, such as shown in FIG. 6. In addition, a timestamp may be stored for the peak. If the filtered phase difference positively exceeds the predetermined positive cycle slip threshold, the method proceeds to step 1006, otherwise it exits.

In step 1006, the filtered phase difference is compared to a predetermined negative cycle slip threshold. The predetermined negative cycle slip threshold may be set at a desired value, such as, for example, a negative 0.5 radians. If the filtered phase difference magnitude negatively exceeds the predetermined negative cycle slip threshold, then a negative peak of a bipolar pulse has occurred. If the filtered phase difference negatively exceeds the predetermined negative cycle slip threshold, a timestamp may be stored and the method proceeds to step 1010, otherwise it passes to step 1020.

In step 1010, the times between the positive peak and the negative peak are compared. If two peaks were found within a predetermined time window (i.e., the bipolar pulse peak has a frequency in the mid-frequency range for the particular loop characteristics), then the bipolar pulse peak is accepted. Therefore, if the frequency of the bipolar pulse is in the mid-frequency range, the method proceeds to step 1016; otherwise, it branches to step 1020.

In step 1016, a positive slip output is generated. This may be in the form of an output pulse, such as a logic one output that may be stored or used in some manner for the cycle slip detection and/or correction. The comparison has determined that a bipolar pulse peak has occurred and that the positive peak has occurred before the negative peak. The method then proceeds to step 1026.

In step 1020, a slip output is generated. The slip output indicates that a cycle slip has occurred, and does not give a cycle slip direction indication. It should be understood that the cycle slip output may be generated by the method even if the cycle slip direction is indeterminate.

The second path of the method is complementary to the first path. In step 1021, the filtered phase difference is compared to the predetermined negative cycle slip threshold. If the filtered phase difference negatively exceeds the predetermined negative cycle slip threshold, then a negative peak has occurred. If the filtered phase difference negatively exceeds the predetermined negative cycle slip threshold, a timestamp may be stored and the method proceeds to step 1028, otherwise it exits.

In step 1028, the filtered phase difference is compared to the predetermined positive cycle slip threshold. If the filtered phase difference magnitude positively exceeds the predetermined positive cycle slip threshold, a positive peak of a bipolar pulse has occurred. If the filtered phase difference positively exceeds the predetermined positive cycle slip threshold, a timestamp may be stored and the method proceeds to step 1033, otherwise it passes to step 1020.

In step 1033, the times between the positive peak and the negative peak are compared. If two peaks were found within a predetermined time window, then the bipolar pulse peak is accepted. Therefore, if the frequency of the bipolar pulse is in the mid-frequency range, the method proceeds to step 1032; otherwise, it branches to step 1020.

In step 1032, a negative slip output is generated. Therefore, a bipolar pulse peak has occurred and the negative peak occurred before the positive peak. The method then proceeds to step 1026.

In this manner, the cycle slip detector may compare the peaks of the bipolar pulse in order to determine a cycle slip direction. The cycle slip direction output will be determinable and if both peaks occur and if the bipolar pulse is within the mid-frequency band. Therefore, by generating either the positive slip output or the negative slip output, the cycle slip detector may signal that a cycle slip has occurred and may signal the direction of the cycle slip. If the cycle slip was positive, then the oscillator 130 has generated a cycle in excess of the input waveform. Conversely, if the cycle slip was negative, then the oscillator 130 has generated a cycle in deficit of the input waveform.

In step 1026, a cycle slip size estimate is generated. The magnitude of the compensated, filtered phase difference is compared to one or more predetermined thresholds or ranges in order to generate a cycle slip size number output. The cycle slip size number may represent partial or whole cycle slips.

The cycle slip size outputs may be fed into a cycle slip counter, a cycle counter, or other circuit, or may be fed to a compensation algorithm or hardware block. The positive and negative cycle slip outputs may be employed to decrement or increment a total cycle count. The output may also be used to ignore a particular data if a cycle slip occurred during transmission, or may be used to perform other cycle slip related error detection and/or correction functions.

It should be understood that if a positive peak occurs without a corresponding negative peak, if a negative peak occurs without a corresponding positive peak, or if the bipolar pulse is outside of the mid-frequency region, then the cycle slip is indeterminate. In this case, the slip output will be generated in step 1020 but the positive slip output and the slip size output will not be generated.

It should also be understood that the method shown is merely one algorithm for detecting occurrences of the bipolar pulse peaks. The invention is not limited to the peak detection algorithm described above, and may detect the peaks in any manner.

Figure 11:
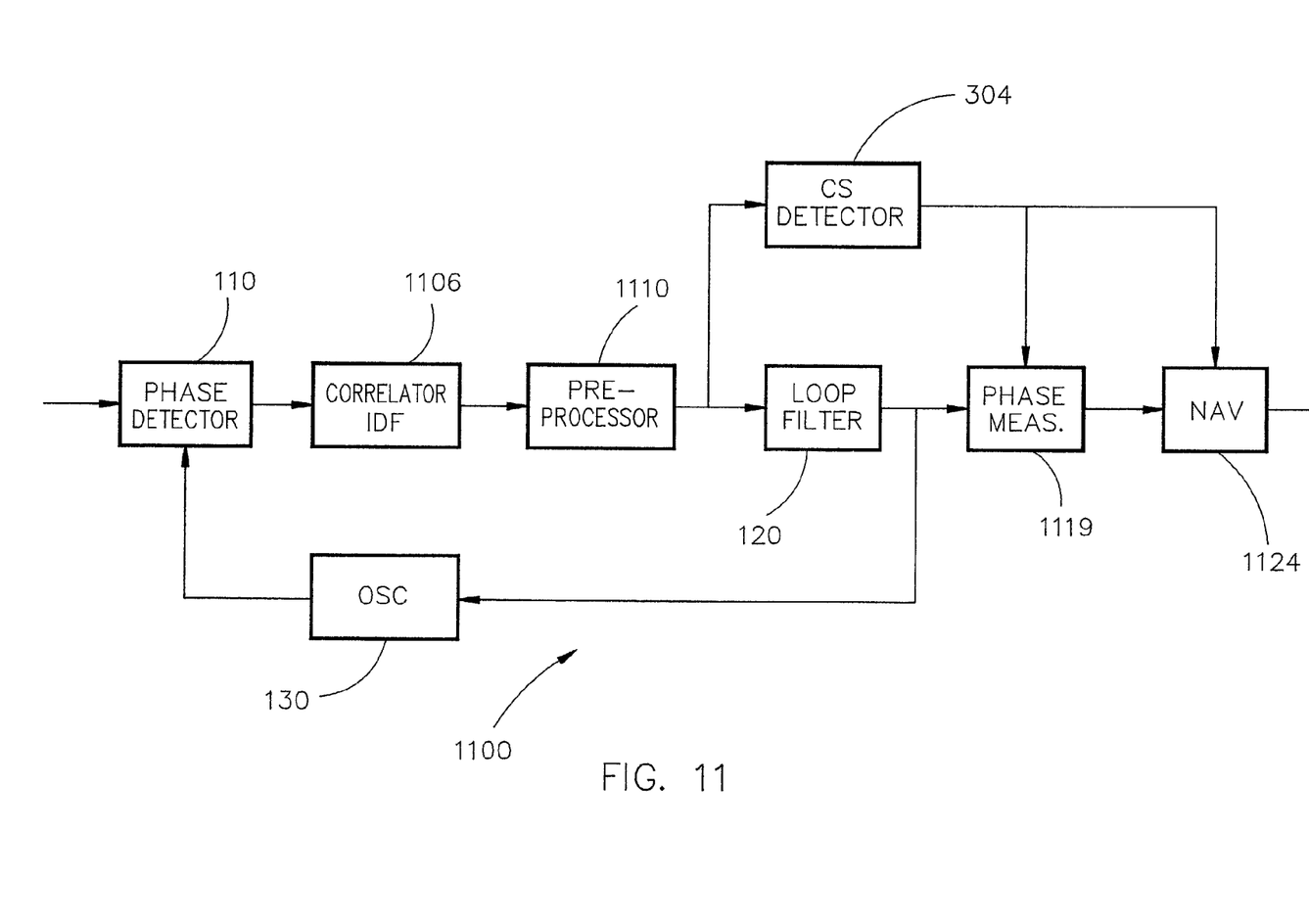
FIG. 11 shows a portion of a GPS receiver employing the cycle slip detector of FIG. 3.

FIG. 11 shows a portion of a GPS receiver 1100 employing the cycle slip detector 304 of FIG. 3. The GPS receiver 1100 includes a correlator IDF (integrate-and-dump filter) 1106, a pre-processor 1110, the cycle slip detector 304, a phase measurement circuit 1119, and a navigation circuit 1124. The cycle slip detector 304 may provide a cycle slip output to both the phase measurement circuit 1119 and the navigation circuit 1124. Therefore, the GPS receiver 1100 may use the cycle slip detector 304 in order to perform a GPS positional fix and improve the resolution and operation of the GPS receiver 1100.

It should be understood that although the GPS receiver 1100 is depicted as comprising blocks of circuitry, the functions of some of the blocks may be performed in software routines, such as the pre-processor 1110 and the navigation circuit 1124, for example. This may further include manipulation and storage of a cycle slip detection output and manipulation and storage of positive and negative cycle slip outputs.

While the invention has been described in detail above, the invention is not intended to be limited to the specific embodiments as described. It is evident that those skilled in the art may now make numerous uses and modifications of and departures from the specific embodiments described herein without departing from the inventive concepts.

What is claimed is:

1. A cycle slip detector adapted for use in a phase comparison circuit, comprising:
   a cycle slip detection filter possessing a predetermined filter bandwidth and a predetermined high frequency cut-off, with said cycle slip detection filter receiving a phase difference generated by said phase comparison circuit and transforming said phase difference into a filtered phase difference;
   a compensator communicating with said cycle slip detection filter, with said compensator compensating a magnitude of said filtered phase difference based on a predetermined compensation response; and
   a cycle slip occurrence detector communicating with said compensator, with said cycle slip occurrence detector comparing the compensated magnitude of said filtered phase difference to a predetermined cycle slip threshold and generating a cycle slip output if said compensated magnitude exceeds said predetermined cycle slip threshold.

2. The cycle slip detector of claim 1, wherein said cycle slip detection filter is a low pass filter.

3. The cycle slip detector of claim 1, wherein said cycle slip detection filter is a band pass filter.

4. The cycle slip detector of claim 1, wherein said predetermined high frequency cut-off is at about 8 Hz.

5. The cycle slip detector of claim 1, wherein said predetermined cycle slip threshold is about 0.5 radians.

6. The cycle slip detector of claim 1, wherein said cycle slip occurrence detector comprises:
   an absolute value detector communicating with said cycle slip detection filter, with said absolute value detector generating an absolute value magnitude from said magnitude of said filtered phase difference; and
   a comparator communicating with said absolute value detector, with said comparator detecting when said absolute value magnitude exceeds a predetermined cycle slip threshold.

7. The cycle slip detector of claim 1, wherein said cycle slip occurrence detector comprises:
   a positive comparator communicating with said compensator and detecting when a positive bipolar pulse peak in said filtered phase difference positively exceeds a predetermined positive cycle slip threshold; and
   a negative comparator communicating with said compensator and detecting when a negative bipolar pulse peak in said filtered phase difference negatively exceeds a predetermined negative cycle slip threshold;
   wherein a slip output is generated when said positive comparator detects a positive bipolar pulse peak or said negative comparator detects a negative bipolar pulse peak.

8. The cycle slip detector of claim 1, wherein said cycle slip detector further comprises:
   a positive comparator communicating with said cycle slip detection filter, with said positive comparator comparing a magnitude of said filtered phase difference to a predetermined positive cycle slip threshold and generating a positive cycle slip output if said magnitude positively exceeds said predetermined positive cycle slip threshold;
   a negative comparator communicating with said cycle slip detection filter, with said negative comparator comparing a magnitude of said filtered phase difference to a predetermined negative cycle slip threshold and generating a negative cycle slip output if said magnitude negatively exceeds said predetermined negative cycle slip threshold;
   a cycle slip direction detector communicating with said positive comparator and said negative comparator, with said cycle slip direction detector receiving said positive and negative cycle slip outputs, with said cycle slip direction detector generating a positive cycle slip output if a positive bipolar pulse peak occurs first in a bipolar pulse and if a bipolar pulse frequency is within a predetermined mid-frequency range, and conversely generating a negative cycle slip output if a negative bipolar pulse peak occurs first in said bipolar pulse and if said bipolar pulse frequency is within said predetermined mid-frequency range; and
   a size estimator communicating with said compensator, with said size estimator generating a cycle slip size estimate based on a magnitude of said compensated, filtered phase difference if both peaks of a bipolar pulse are detected by said cycle slip direction detector.

9. A cycle slip detection method for detecting a cycle slip in a phase comparison circuit, comprising the steps of:
   filtering out phase difference frequency components above a predetermined high frequency cut-off to produce a filtered phase difference;
   detecting a cycle slip in said filtered phase difference and generating a cycle slip output if a filtered phase difference magnitude exceeds a predetermined cycle slip threshold;
   detecting a positive bipolar pulse peak in said filtered phase difference if a filtered phase difference magnitude positively exceeds a predetermined positive cycle slip threshold;
   detecting a negative bipolar pulse peak in said filtered phase difference if a filtered phase difference magnitude negatively exceeds a predetermined negative cycle slip threshold;
   generating a positive cycle slip output if said positive bipolar pulse peak occurs before a corresponding negative bipolar pulse peak and if said bipolar pulse frequency is within a predetermined mid-frequency range;
   generating a negative cycle slip output if said negative bipolar pulse peak occurs before said positive bipolar pulse peak and if said bipolar pulse frequency is within said predetermined mid-frequency range; and estimating a cycle slip size based on a magnitude of a compensated, filtered phase difference if both peaks of a bipolar pulse are detected.

10. The method of claim 9, further comprising a step of compensating a magnitude of said filtered phase difference based on a predetermined compensation response before said detecting step.

11. The method of claim 9, wherein said step of detecting a cycle slip further comprises:
compensating a magnitude of said filtered phase difference based on a predetermined compensation response to produce a compensated magnitude;
generating an absolute value magnitude from said compensated magnitude;
detecting when said absolute value magnitude exceeds a predetermined cycle slip threshold; and
generating the cycle slip output.

12. The method of claim 9, wherein said step of detecting a cycle slip further comprises:
compensating a magnitude of said filtered phase difference based on a predetermined compensation response to produce a compensated magnitude;
detecting when a positive bipolar pulse peak in said filtered phase difference positively exceeds a predetermined positive cycle slip threshold; and
detecting when a negative bipolar pulse peak in said filtered phase difference negatively exceeds a predetermined negative cycle slip threshold;
wherein the cycle slip output is generated if a positive bipolar pulse peak or a negative bipolar pulse peak are detected.

13. The method of claim 9, further comprising a step of detecting a cycle slip direction.

14. The method of claim 9, wherein said cycle slip size and positive cycle slip output and said negative cycle slip output are used to correct a cycle slip occurrence.

15. The method of claim 9, wherein said cycle slip size and positive cycle slip output and said negative cycle slip output are stored in order to accumulate a cycle slip correction factor.

16. A cycle slip detection method for detecting a cycle slip in a phase comparison circuit, comprising the steps of:
filtering out phase difference frequency components above a predetermined high frequency cut-off to produce a filtered phase difference;
compensating a magnitude of said filtered phase difference based on a predetermined compensation response; and
detecting a cycle slip in said compensated filtered phase difference and generating a cycle slip output if the compensated filtered phase difference magnitude exceeds a predetermined cycle slip threshold.

17. The method of claim 16, further comprising a step of detecting a cycle slip direction.

18. The method of claim 16, further comprising the steps of:
detecting a positive bipolar pulse peak in said filtered phase difference if a filtered phase difference magnitude positively exceeds a predetermined positive cycle slip threshold;
detecting a negative bipolar pulse peak in said filtered phase difference if a filtered phase difference magnitude negatively exceeds a predetermined negative cycle slip threshold;
generating a positive cycle slip output if said positive bipolar pulse peak occurs before a corresponding negative bipolar pulse peak and if said bipolar pulse frequency is within a predetermined mid-frequency range; and
generating a negative cycle slip output if said negative bipolar pulse peak occurs before said positive bipolar pulse peak
and if said bipolar pulse frequency is within said predetermined mid-frequency range.

19. The method of claim 16, further comprising the step of estimating a cycle slip size based on a magnitude of a compensated, filtered phase difference if both peaks of a bipolar pulse are detected.

* * * * *